United States Patent [19]
Akamatsu

[11] 4,162,413
[45] Jul. 24, 1979

[54] SEMICONDUCTOR SWITCH

[75] Inventor: Masahiko Akamatsu, Amagasaki, Japan

[73] Assignee: Mitsubishi Denki Kabushiki Kaisha, Tokyo, Japan

[21] Appl. No.: 843,665

[22] Filed: Oct. 19, 1977

Related U.S. Application Data

[63] Continuation of Ser. No. 704,492, Jul. 12, 1976, abandoned.

[30] Foreign Application Priority Data

Sep. 12, 1975 [JP] Japan .............................. 50-111303

[51] Int. Cl.² ...................... H03K 17/04; H03K 17/56
[52] U.S. Cl. ................................ 307/253; 307/252 J; 307/305; 357/38

[58] Field of Search .......... 307/252 A, 252 C, 252 H, 307/252 J, 252 M, 252 N, 305, 253-255; 357/38

[56] References Cited
U.S. PATENT DOCUMENTS
3,619,652 11/1971 Ogle ................................ 307/305 X Primary Examiner—John Zazworsky
Attorney, Agent, or Firm—Oblon, Fisher, Spivak, McClelland & Maier

[57] ABSTRACT

A semiconductor switch comprising: a transistor; a thyristor connected between the collector and the base of the transistor; a first control device connected to the gate of the thyristor for supplying a gate current to the thyristor and thus turning on the thyristor; and a second control device connected to the base of the transistor for supplying a base current to the transistor and thus turning off the thyristor.

4 Claims, 14 Drawing Figures

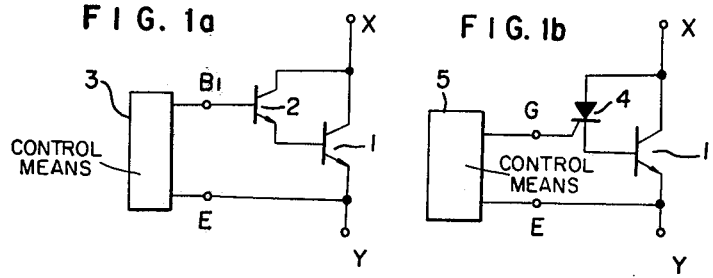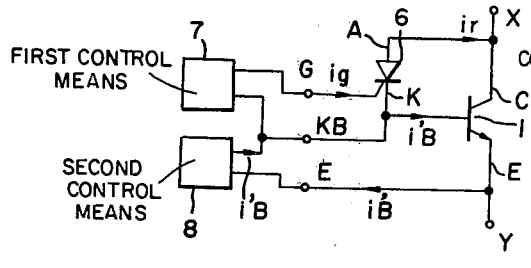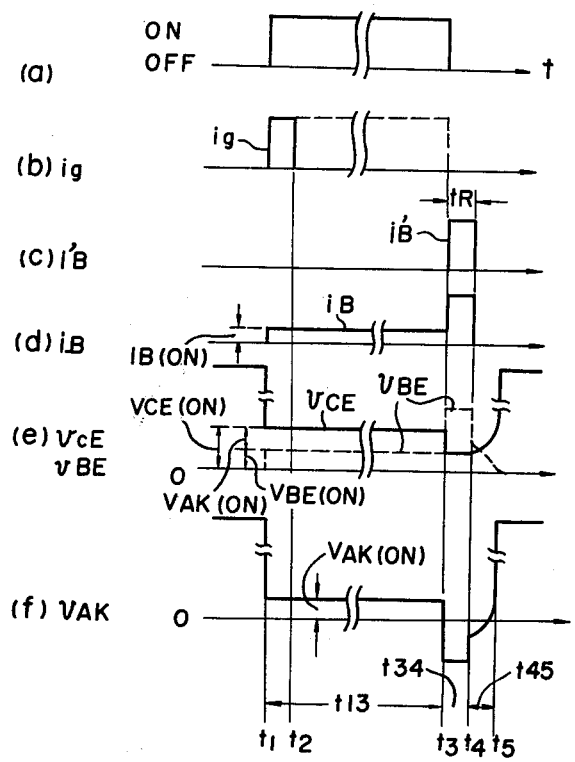

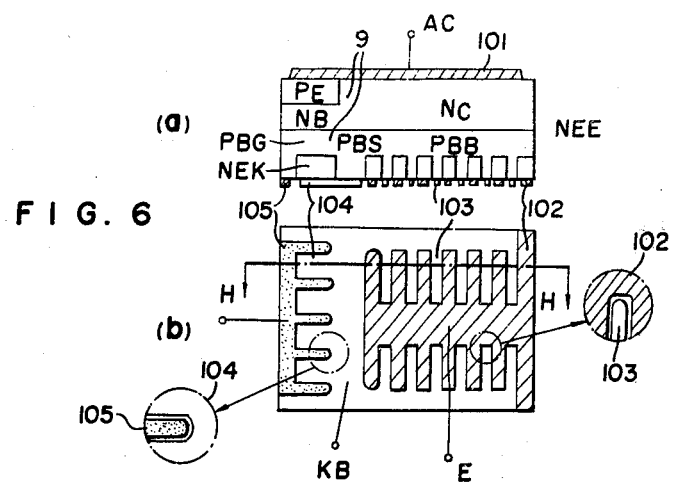
FIG. 6
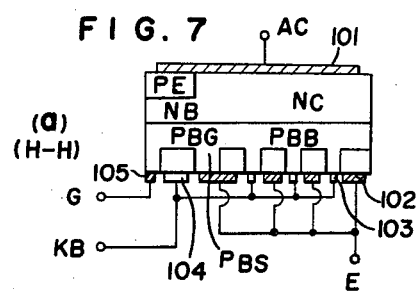
FIG. 7
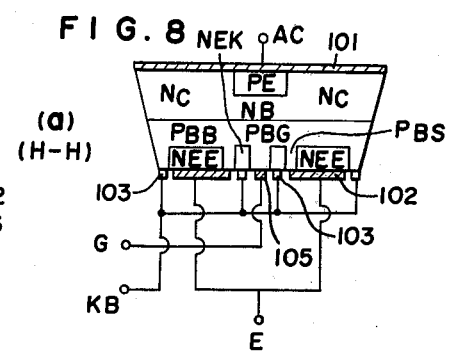
FIG. 8
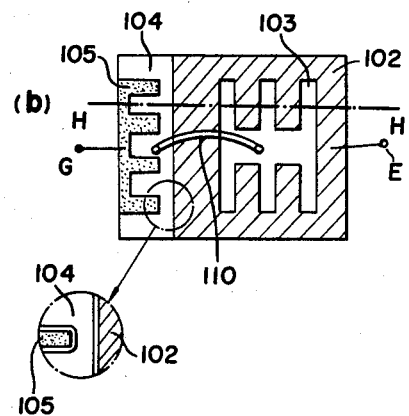
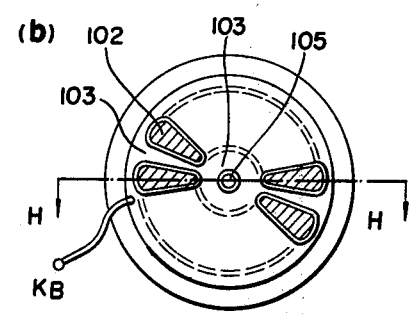
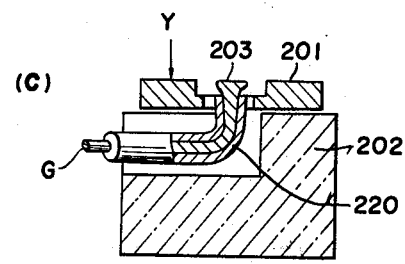

SEMICONDUCTOR SWITCH

This is a continuation of application Ser. No. 704,492, filed July 12, 1976, now abandoned.

BACKGROUND OF THE INVENTION

1. Field of the Invention

The present invention relates to improvements in semiconductor switches.

2. Description of the Prior Art

Semiconductor switches as shown in FIGS. 1(a) and 1(b) are well-known. FIG. 1(a) is a circuit diagram of a Darlington transistor switch, which comprises a main transistor 1, an auxiliary transistor 2 connected between the collector and the base of the main transistor 1, and a control means 3 for controlling the base current to the auxiliary transistor 2. FIG. 1(b) shows another switch circuit comprising a main transistor 1, and a gate-turn-off thyristor 4 connected between the collector and the base of the main transistor 1, wherein a forward pulse (or a continuous current) is supplied to the gate G of the thyristor 4 to turn it on, and a reverse bias pulse is supplied to the gate G to turn it off.

In the circuit shown in FIG. 1(a), it is necessary to continuously supply a sufficient amount of base current during the on period. Furthermore, a sharp rise in the collector voltage is inevitable in an overcurrent region, resulting in a low capacity of the circuit against a peak current. Whereas, in the circuit shown in FIG. 1(b), the voltage drop in the thyristor 4 does not acutely increase in an overcurrent region and hence the collector voltage in the main transistor 1 does not acutely rise, resulting in a large capacity of the circuit against a peak current. In this circuit, however, difficulties are involved in turning off the thyristor 4, which necessitates intricate gate structure for the thyristor. In other words, the voltage drop in the thyristor 4 is large and the collector voltage drop in the main transistor 1 increases accordingly.

A principal aim of the present invention is to reduce the turn-off duty for the thyristor 4 which drives the base of the main transistor 1.

SUMMARY OF THE INVENTION

It is therefore an object of the present invention to provide a semiconductor switch comprising a transistor and a thyristor connected between the collector and the base of the transistor, wherein a pulse current is supplied to the base of the transistor to permit the thyristor to be readily turned off.

It is another object of the invention to provide a semiconductor switch operable with desirable turn-off characteristics by applying a reverse bias to the gate of the thyristor used.

It is another object of the invention to provide a semiconductor switch comprising a thyristor and a diode or a diode circuit connected in reverse parallel to the thyristor whereby the storage time is reduced and thus the overall turn-off time is reduced.

The objects of the present invention are achieved by a semiconductor switch comprising a transistor, a thyristor connected between the collector and the base of the transistor, first control means connected to the gate of the thyristor for supplying a gate current to the thyristor, thereby turning on the thyristor, and second control means connected to the base of the transistor for supplying a base current to the transistor, thereby turning off the thyristor.

Further objects, features and advantages of the present invention will become more apparent from the following description taken in conjunction with with the accompanying drawings, wherein:

BRIEF DESCRIPTION OF THE DRAWINGS

FIGS. 1(a) and 1(b) are circuit diagrams showing prior art semiconductor switches, FIGS. 2(a), 2(b), 2(c) and 2(d) are circuit diagrams showing semiconductor switches of the invention, FIGS. 3 and 4 are waveform diagrams illustrating operations of the circuits as in FIG. 2, FIGS. 6 to 8 are conceptual constructional diagrams showing composite semiconductor switch devices according to the invention.

DETAILED DESCRIPTION OF THE PREFERRED EMBODIMENTS

Figure 2C:
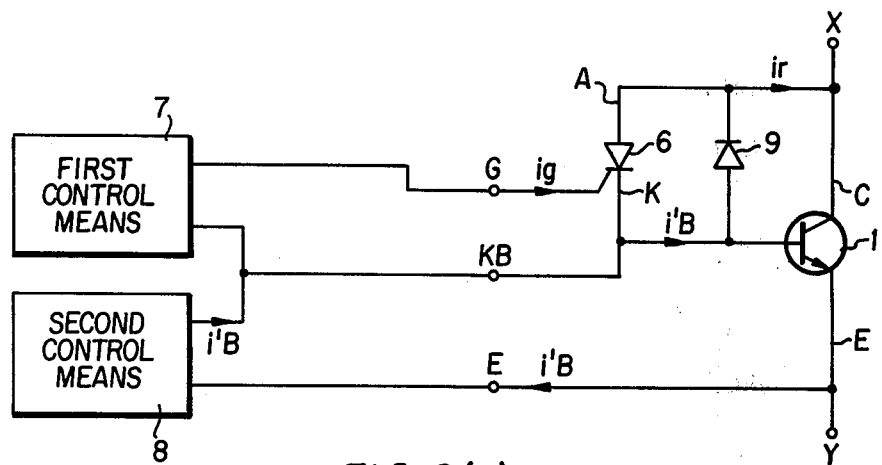

Referring to FIGS. 2(a) and 2(b), there are shown circuit diagrams of semiconductor switches embodying the invention, which comprise an auxiliary thyristor 6, e.g., a thyristor having no gate-turn-off function, a thyristor operable with a reverse bias applied to its gate, or a gate-turn-off thyristor. The switch circuits further comprise a first control means 7 for supplying a gate current $i_g$ to the auxiliary thyristor 6, and a second control means 8 for supplying a pulse base current $i_B'$ to a main transistor 1.

Operations of these circuits will be described in reference to waveforms shown in FIGS. 3 and 4. In FIG. 2(a), the first control means 7 supplies the auxiliary thyristor 6 with a pulse gate current $i_g$ which is indicated by the solid line, or a continuous gate current $i_g$ which is indicated by the dotted line in FIG. 3(b) in order to turn on the main transistor 1. This operation causes a steady base current $I_{B(ON)}$ as in FIG. 3(d) to flow for the period $t_{13}$. This base current is part of a current flowing across switch terminals X and Y, which has been shunted to the thyristor 6.

The collector voltage $V_{CE(ON)}$ of the main transistor 1 for the steady turn-on time $t_{13}$ is the sum of the base-emitter voltage drop $V_{BE(ON)}$ of the main transistor 1 and the anode-cathode voltage drop $V_{AK(ON)}$ of the thyristor 6 as indicated by waveforms (e) and (f) in FIG. 3.

To turn off the switch at time $t_3$, a pulse base current $i_B'$ shown in FIG. 3(c) is supplied to the main transistor 1 from the second control means 8. During the period $t_R$ ($=t_{34}$) of the base current $i_B'$, the base-emitter voltage drop $V_{BE}$ increases and a pulse base current $i_B'$ larger than $I_{B(ON)}$ flows, causing the collector-emitter voltage $V_{CE}$ to decrease. As a result, the anode-cathode voltage $V_{AK}$ of the auxiliary thyristor 6 is lowered and eventually becomes inverted since $V_{AK}=V_{CE}-V_{BE}$. Therefore, with a sufficiently large pulse base current $i_B'$ supplied, the collector-emitter voltage $V_{CE}$ becomes nearly equal to or smaller than the base-emitter voltage $V_{BE}$, that is, the anode-cathode voltage $V_{AK}$ becomes nearly equal to or smaller than zero ($V_{AK} \leq 0$). For a certain length of time after the removal of the pulse base current $i_B'$, the collector-emitter voltage $V_{CE}$ does not rise rapidly. At the time $t_5$ after the storage time $t_{45}$, the collector-emitter voltage $V_{CE}$ rises to accomplish turn-off. Thus the auxiliary thyristor 6 restores its forward blocking capacity during the pulse base current supplying time $t_{34}$ and the storage time $t_{45}$.

As described above, the base current is supplied continually to the main transistor through the thyristor and hence the turn-on control signal may be a pulse to the gate. To turn off the main transistor, it is only necessary to supply the pulse base current $i_B'$ to the main transistor 1 for a given period of time. During this operation, the thyristor current is maintained below the holding current or the thyristor gate is reversely biased, to permit the thyristor to be readily turned off. When the pulse base current $i_B'$ is large enough, the thyristor 6 is reversely biased, with the result that a part $i_r$ of the pulse base current $i_B'$ goes to the collector-emitter circuit of the transistor reversely through the thyristor 6 and thus serves as a current $i_r$ which restores the thyristor 6 reversely. In this circuit, therefore, the auxiliary thyristor 6 is not necessarily of the gate-turn-off type.

Figure 4:
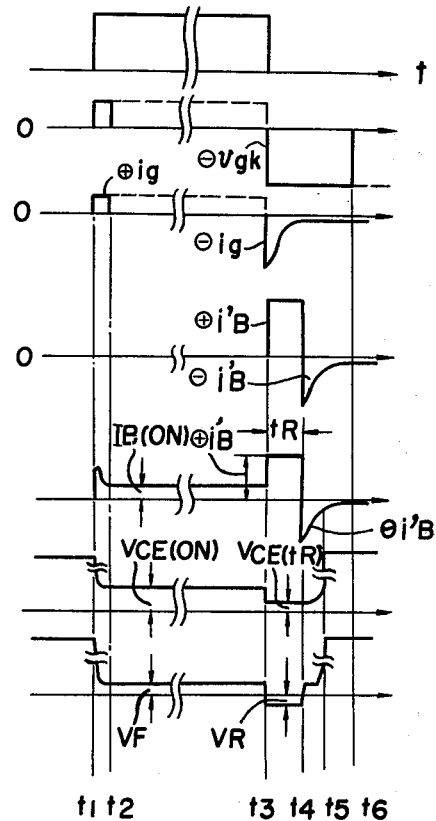

FIG. 4 shows waveforms useful for illustrating operations for turning off the thyristor 6 by reversely biasing its gate; the waveform (b) or (c) is a reverse bias voltage $\ominus V_{gk}$ or a reverse bias gate current $\ominus i_g$. By this reverse biasing, the time required to restore the forward blocking capacity of the thyristor is reduced to enable the overall turn-off time to be decreased.

The base reverse bias current $\ominus i_B'$ may be applied during the period $t_4 - t_6$ for which the transistor is off. This makes it possible to reduce the storage time and minimize its variation and thus reduce the overall turn-off time.

When the thyristor 6 is of the gate-turn-off type, the thyristor anode current $I_{AK(OFF)}$ flowing at the time the thyristor is turned off by reversely biasing its gate or immediately before the forward voltage rises becomes smaller than the steady base current $I_{B(ON)}$, that is, $I_{AK(OFF)} = I_{B(ON)} - i_B'$. Thus the turn-off anode current which is essentially responsible for thyristor turn-off is reduced. Unlike the conventional switch shown in FIG. 1(b), the switch of this invention can turn off a large switch current when a gate-turn-off thyristor is used under the same gate reverse biasing condition.

Figure 2D:
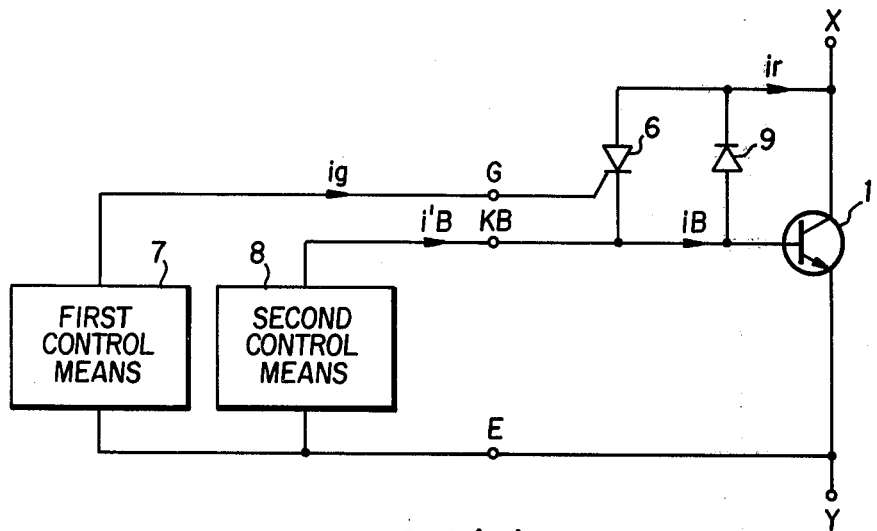

In FIGS. 2(c) and 2(d), a diode 9 is connected in reverse parallel to the thyristor 6, and that a pulse base current $i_B'$ is supplied in order to turn off the thyristor 6. Then the diode 9 turns on when the voltage $(V_{BE} - V_{CE})$ exceeds the threshold voltage of the diode 9. More specifically, the pulse base current $i_B'$ is shunted to the diode 9 when the thyristor 6 is biased slightly in the reverse direction. This prevents the collector voltage $V_{CE}$ from being excessively lowered and the pulse base current from being excessively supplied. As a result, the transistor storage time $t_{45}$ after the removal of the pulse base current can be reduced.

Figure 5:
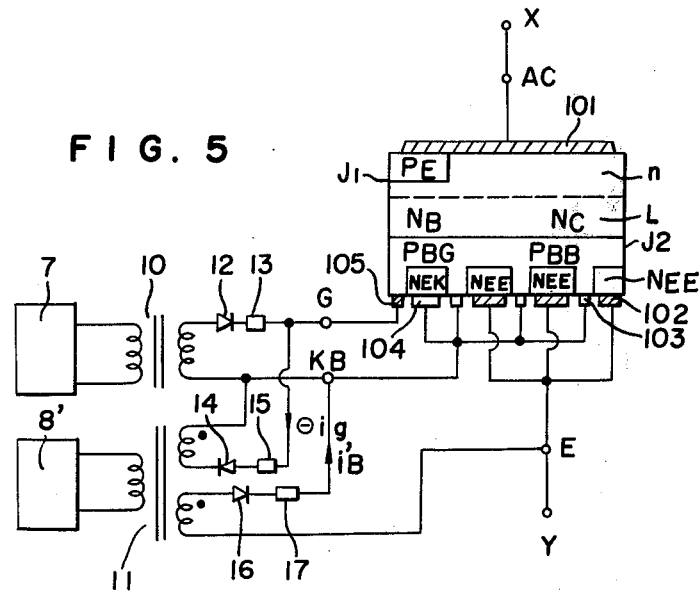
FIG. 5 is a schematic diagram showing one embodiment of the invention.

FIG. 5 schematically illustrates a semiconductor device embodying this invention, which comprises a three-layer transistor region $N_C$-$P_{BB}$-$N_{EE}$ and a four-layer thyristor region $P_E$-$N_B$-$P_{BG}$-$N_{EK}$. The two regions are formed integrally on one semiconductor wafer. The collector layer $N_C$ and the anode layer $P_E$ are bridged by a first contact 101 and led out as an anode-collector common terminal AC. A fourth contact 104 having contact with the cathode layer $N_{EK}$ is connected to a third contact 103 having contact with the base layer $P_{BB}$, which are led out as a cathode-base common terminal KB. The emitter layer $N_{EE}$ has contact with a second contact 102 wherefrom an emitter terminal E is led out. The gate layer $P_{BG}$ has contact with a fifth contact 105 wherefrom a gate terminal G is led out. The junction between the thyristor base layer $N_B$ and the gate layer $P_{BG}$ and the junction between the transistor collector layer $N_C$ and the base layer $P_{BB}$ stand on the same level.

In FIG. 5, a pulse base current $i_B'$ is supplied from a second control means 8' through a pulse transformer 11, and a reverse bias gate current $\ominus i_g$ is supplied to the semiconductor switch. This circuit comprises diodes 12, 14 and 16, circuit elements 13, 15 and 17, e.g., resistors.

FIGS. 6 to 8 are conceptual structural diagrams showing semiconductor devices embodying the invention. FIG. 6(a) is a sectional view taken across H—H of FIG. 6(b) which is a bottom contact pattern. In the embodiment shown in FIG. 6, a third contact 103 is common to a fourth contact 104, and a split region $P_B$, i.e., $P_{BS}$, between the thyristor and transistor portions is brought into contact with the fourth contact to short them. This arrangement serves to hold the transistor current in the region $P_{BS}$, thus preventing it from escaping to the thyristor part so as not to allow the thyristor to turn back on when driven to turn-off. Making the third and fourth contacts common simplifies the overall device construction. The layers $P_{BS}$ and $N_C$ serve as a diode 9 connected in reverse parallel to the thyristor part.

FIG. 7 schematically illustrates another embodiment of the invention wherein third and fourth contacts are formed separately and the split layer $P_{BS}$ and the second contact 102 are shorted together. By this arrangement, the separation of the transistor part from the thyristor part is improved and the turn-off characteristic of the thyristor is improved accordingly. In this construction, the split layer $P_{BS}$ is shorted to the emitter E and hence no transistor current goes to the region on the layer $P_{BS}$ and the diffusion of the transistor current into the thyristor part is minimized. The third and fourth contacts 103 and 104 are connected together by a jumper wire 110.

In the embodiment shown in FIG. 8, an auxiliary thyristor of point center gate type is formed in the center part of the semiconductor switch; FIG. 8(a) is a cross-sectional view taken across H—H of a bottom contact pattern shown in FIG. 8(b), and FIG. 8(c) is a cross-sectional view of bottom lead-out contact member. In FIG. 8(a), the center gate layer $P_{BG}$ may be radial lines or plane construction instead of the point. An emitter contact 102 is brought into contact with the top of a raised portion Y (indicated by an arrow in FIG. 8(c)) of an intermediate contact member 201 by pressure welding or soldering.

The intermediate contact member 201 consists of a metal having a pattern similar to the pattern of emitter contact 102 of FIG. 8(b) and has a small, raised surface Y, which is bonded to the contact 102 by welding the metal (such as aluminum) or by soldering. The gate contact 105 is brought into contact with a lead link 203 having an insulation coating 220 by pressure welding. The intermediate contact 201 is bonded to a copper block 202 by pressure welding.

Thus, as shown in FIGS. 6 to 8, a composite semiconductor device is formed, which comprises a thyristor part and a transistor part, the anode and the cathode of the thyristor part being connected between the collector and the base of the transistor part. This semiconductor switch device is useful for the foregoing purposes of the invention.

As has been described above, the present invention provides improvements in semiconductor switches of the type comprising a transistor and a thyristor connected between the collector and the base of the transistor wherein a pulse current is supplied to the base of the transistor to permit the thyristor to be readily turned off. Furthermore, according to the invention, the turn-off characteristic is improved by the use of a reverse bias applied to the gate of the thyristor. Furthermore, a diode or a diode circuit is connected in reverse parallel to the thyristor and thus the storage time is reduced and the overall turn-off time is diminished.

While a few preferred embodiments of the invention and specific modifications thereof have been described, it is to be understood that many variations may occur to those skilled in the art without departing from the true spirit of the present invention.

What is claimed is:

1. A semiconductor switch comprising:
a transistor having a collector, an emitter and a base,
a thyristor having two main electrodes and a gate,
the main electrodes being connected in between the collector and the base of the transistor,
means for connecting the collector and the emitter of the transistor between an external power source and a load,
control means for applying a control signal to the gate of the thyristor,
means for supplying pulse current to the base of the transistor,
the pulse current being supplied to the base by the pulse supplying means to turn off the thyristor by generating a reverse bias between the two main electrodes of the thyristor,
a diode having an anode and a cathode,
the anode of the diode being connected to one of the main electrodes of the thyristor,
the cathode of the diode being connected to the other main electrode of the thyristor.

2. A semiconductor switch comprising:
a transistor having a collector, an emitter and a base,
a thyristor having two main electrodes and a gate,
the main electrodes being connected between the collector and the base of the transistor,
means for connecting the collector and the emitter of the transistor between an external power source and a load,
control means for applying a control signal to the gate of the thyristor,
means for supplying pulse current to the base of the transistor,
the forward pulse current being supplied to the base by the pulse supplying means to turn off the thyristor be generating a reverse bias between the two main electrodes of the thyristor,
the voltage drop between the base and the emitter of the transistor caused by supplying the pulse current being greater than the voltage drop between the collector and the emitter caused during the supply of the pulse current in order to generate a reverse bias between the main electrodes of the thyristor.
wherein the transistor and the thyristor are formed integrally on one semiconductor wafer.

3. A semiconductor switch comprising:
a transistor having a collector, an emitter and a base,
a thyristor having two main electrodes and a gate,
the main electrodes being connected between the collector and the base of the transistor,
means for connecting the collector and the emitter of the transistor between an external power source and a load,
means controlling the gate of the thyrisort,
means for supplying base current to the base of the transistor,
the base current being supplied to the base by the base current supplying means to turn off the thyristor by causing the means controlling the gate of the thyristor to gate-reverse bias the thyristor,
a diode having an anode and a cathode,
the anode of the diode being connected to one of the main electrodes of the thyristor,
the cathode of the diode being connected to the other main electrode of the thyristor.

4. A semiconductor switch comprising:
a transistor having a collector, an emitter and a base,
a thyristor having two main electrodes and a gate,
the main electrodes being connected between the collector and the base of the transistor,
means for connecting the collector and the emitter of the transistor between an external power source and a load,
means controlling the gate of the thyristor,
means for supplying base current to the base of the transistor,
the base current being supplied to the base by the base current supplying means to turn off the thyristor by causing the means controlling the gate of the thyristor to gate-reverse bias the thyristor,
the voltage drop between the base and the emitter of the transistor caused by supplying the forward base current being greater than the voltage drop between the collector and the emitter caused during the supply of the forward base current in order to generate a reverse bias between the main electrodes of the thyristor,
wherein the transistor and the thyristor are formed integrally on one semiconductor wafer.

* * * * *